US006573736B1

(12) United States Patent
Lee et al.

(10) Patent No.: US 6,573,736 B1
(45) Date of Patent: Jun. 3, 2003

(54) PRIMARY ION OR ELECTRON CURRENT ADJUSTMENT TO ENHANCE VOLTAGE CONTRAST EFFECT

(75) Inventors: Jeng-Han Lee, King-men (TW); Su-Chen Lee, ba-de (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/042,571

(22) Filed: Jan. 9, 2002

(51) Int. Cl.[7] .............................................. G01R 31/305
(52) U.S. Cl. ....................................................... 324/751
(58) Field of Search ............................... 438/14; 324/751

(56) References Cited

U.S. PATENT DOCUMENTS

| | | | |
|---|---|---|---|
| 4,678,988 A | 7/1987 | Brust | 324/158 R |
| 6,038,018 A | 3/2000 | Yamazaki et al. | 356/237.1 |
| 6,091,249 A | 7/2000 | Talbot et al. | 324/751 |
| 6,201,240 B1 | 3/2001 | Dotan et al. | 250/310 |
| 6,232,787 B1 * | 5/2001 | Lo | 324/751 |
| 6,344,750 B1 * | 2/2002 | Lo | 324/751 |

OTHER PUBLICATIONS

The article "Defect Isolation and Characterisation in Contacts by Using Primary Current Level Adjustment," no author or publication listed, was also cited.

* cited by examiner

*Primary Examiner*—John F. Niebling
*Assistant Examiner*—Andre' C Stevenson
(74) *Attorney, Agent, or Firm*—George O. Saile; Stephen B. Ackerman

(57) ABSTRACT

A new method is provided for identifying Voltage Contrast that is applied for the evaluation of characteristics of deposition of thin layers of semiconductor material. The voltage contrast is enhanced by applying increased electron beam current, provided by either E-beam or ion-beam current, to the point under investigation.

14 Claims, 2 Drawing Sheets

PRIMARY ION OR ELECTRON CURRENT ADJUSTMENT TO ENHANCE VOLTAGE CONTRAST EFFECT

BACKGROUND OF THE INVENTION (1) Field of the Invention

The invention relates to the fabrication of integrated circuit devices, and more particularly, to a method for the identification of defects or imperfections in components or component elements during the creation of semiconductor devices.

(2) Description of the Prior Art

In the case of faulty operation of semiconductor devices, defects must be located such that the devices under investigation can be compared with nominal or expected behavior of the devices. For this purpose, the method of Voltage Contrast (VC) is applied whereby a voltage of a specific frequency is applied to the point that is being measured, the applied voltage causes secondary electrons to be released by the primary electrons at the point that is being measured. The secondary electrons are observed by a detector and are further amplified into a signal that can be measured and evaluated. Specifically, the observed signal is analyzed for the frequency or frequency spectrum that is emitted by the point under investigation.

Three methods are known in the art for determining whether specific internal periodic signals of a specific frequency are present at the point of observation in a semiconductor circuit. The first method, referred to as voltage coding, images the dynamic voltage of the integrated circuit on a monitor. The second method, referred to as logic state mapping, images the dynamic voltage distribution with the aid of a stroboscope effect. The third method uses locating a specific frequency at the point that is being measured by using a lock-in amplifier. A signal with the sought-for frequency is filtered out-off the response signal after which the intensity of the signal is imaged as a variation in the brightness of the signal.

The passive voltage or voltage coding method is a frequently applied method that can be used to for instance isolate points of leakage in a polysilicon gate. This method however is, as is the case for many of the disciplines that are required for the creation of ever further miniaturized semiconductor devices, also effected by this process of miniaturization. With the increased miniaturization of semiconductor devices, the layer of gate oxide that is created as an interface between the silicon substrate and the overlying gate electrode becomes increasingly thinner. For typical thin layers of gate oxide, a bright voltage contrast is observed due to the tunneling current that is induced in the thin layer of gate oxide. Due to this bright voltage contrast however it is difficult, for thin layers of gate oxide, to identify and distinguish imperfections such as leakage currents in a thin layer of gate oxide. Current practice is to use a constant current to enhance the observable voltage contrast (VC). With the lower thickness of oxide layers, such as layers of gate oxide of about 20 Angstrom thick, this method however is no longer usable and can only be used to distinguish opens and shorts. An alternate method of creating enhanced voltage contrast is provided by the invention.

U.S. Pat. No. 6,091,249 (Talbot et al.) shows an ion-beam and electron-beam in a Voltage Contrast defect detection method.

U.S. Pat. No. 6,201,240 (Dotan et al.) discusses contrast PVC in SEM technology.

U.S. Pat. No. 6,232,787 (Lo et al.) shows the use of VC and electron current in the detection of structure defects.

U.S. Pat. No. 6,038,018 (Yamazaki et al.) and U.S. Pat. No. 4,678,988 (Brust) are related patents.

SUMMARY OF THE INVENTION

A principle objective of the invention is to provide an enhanced method of Voltage Contrast (VC) detection for the evaluation of characteristics of deposition of thin layers of semiconductor material.

In accordance with the objectives of the invention a new method is provided for identifying Voltage Contrast that is applied for the evaluation of characteristics of deposition of thin layers of semiconductor material. The voltage contrast is enhanced by applying increased electron beam current, provided by either E-beam or ion-beam current, to the point under investigation.

DESCRIPTION OF THE PREFERRED EMBODIMENTS

Figure 1:
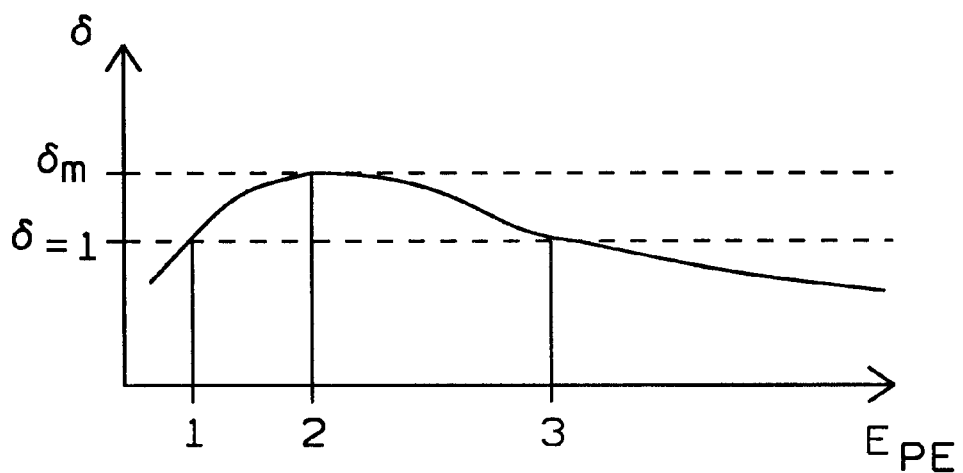
FIG. 1 shows a curve that reflects Secondary Electron (SE) yield, plotted along the Y or vertical axis, as a function of the energy of the Primary Electrons (PE) of the electrons that are reflected by the surface at which the secondary electrons are aimed.

It is well known in the art that the Voltage Contrast that can be used for the evaluation of characteristics of deposition of semiconductor layers is dependent on the electrostatic voltage level or potential of the surface of the layer of material that is being evaluated. This latter surface potential is dependent on the secondary electrons that are radiated by the surface during and as a result of the process of evaluation. The invention teaches a method whereby a voltage contrast can be enhanced by applying a stream of electrons, the stream of electrons is provided by an E-beam or ion-beam source of electrons. As control parameters during this process can be used the density of the stream of electrons that is directed at the surface under investigation.

It has been observed and confirmed that a larger flow of electrons that is provided by either an E-beam source or an ion-beam source of electrons enhances the observable voltage contrast. This control parameter can be used to evaluate layers of different thicknesses and to evaluate junctions of impurity implants into the surface of a silicon substrate, such as (N+/PW) and (P+/NW) junctions under various conditions of implant depth, implant energy and the like. The following observations have been made using the method of the invention:

1. increased electron current, that is provided by an E-beam or ion-beam, increases the VC effect thereby enhancing the observation capability
2. gate leakage currents that occur in ultra-thin layers of gate oxide can be detected, and
3. junction leakage, such as can occur in (N+/PW) and (P+/NW) junctions, can be identified.

The basic principle of Voltage Contrast can be explained by comparing two biasing conditions of a semiconductor element, such as the surface of a silicon semiconductor substrate. Biasing this element to a value of for instance −5 Volts results in a zone of negative charges close to the surface of the element. Any electrons that are externally directed at the surface of the element are therefore rejected at a high rate since these electrons are repelled by the negatively charged surface of the element. A brighter contrast will therefore be observed of the (negatively charged) surface that is bombarded with the electrons.

Now biasing this element to a value of for instance +5 Volts results in a zone of positive charges close to the surface of the element. Any electrons that are externally directed at the surface of the element are therefore attracted by the surface at a high rate, since these electrons are attracted or trapped by the positively charged surface of the element. A lesser bright contrast will therefore be observed of the (positively charged) surface that is bombarded with the electrons.

The following discussion is based on the method of the invention of bombarding a semiconductor surface, such as the surface of a silicon substrate in or on the surface of which semiconductor elements have been created, with electrons using either an E-beam or an ion-beam as the source of the electrons.

FIG. 1 shows a curve that reflects Secondary Electron (SE) yield, plotted along the Y or vertical axis, as a function of the energy of the Primary Electrons (PE) of the electrons that are reflected by the surface at which the secondary electrons are aimed. Clearly distinguished in this definition are the two sources of electrons. The first source is the surface from which electrons are reflected, these electrons are referred to as the primary electrons. A second source is the secondary source of emission of electrons, these electrons are aimed at a surface that is being investigated and are referred to as the secondary electrons. The SE yield is defined as the ratio between the energy of the electrons of the second source to the first source, that is the energy of total electrons that are emitted by the source of electrons and the energy of the primary electrons that are being emitted (reflected) by the surface that is being bombarded by the secondary electrons. Issuing from the electron source are the Total Electrons emitted, these electrons strike a surface (or more exactly: a point that is being evaluated in a surface), as a result of the impact of these electrons on the surface, Primary Electrons (PE) are emitted by the surface. The PE is being observed, an observation from which conclusions can be drawn that relate to the characteristics of the point that is being evaluated in the surface. The typical method that is applied for performing the observation is to capture the stream of PE in a Electron Detector ED, the electron density can be differentiated in the ED and, based on this differentiation, a signal is created by the ED that is fed into various components of a measuring apparatus (such as a photo-multiplier and a pre-amplifier) after which the amplified signal, which is representative of the density of the stream of PE, is displayed for observation.

From the above provided explanation of how the positive or negative charge of the surface that is being struck affects the reflected Primary Electrons PE, and knowing the SE yield ratio, it can be concluded that if the SE ratio exceeds 1 then more total electrons are being emitted than the stream of Primary Electrons. From this can be concluded that the surface that has been struck by the stream of Total electrons emitted has a positive bias. The inverse line of reasoning leads to the conclusion that a value for SE yield that is smaller than 1 indicates that the surface that has been struck by the stream of electrons is negatively charged. Relating these observations back to the graph that is shown in FIG. 1, with $\delta$ being the previously defined Secondary Electron yield that is plotted along the vertical or Y-axis while the Primary Electron energy is plotted along the horizontal or X-axis, the following points can be identified:

the value of $\delta=1$; for this value $\delta=1$ there are two corresponding values of PE, that is points 1 and 3 along the X-axis for a value of PE along the X-axis that is between the values of PE that are represented by points 1 and 3, the value $\delta$ exceeds the value 1, indicating that for this portion of the curve the total emitted number of electrons exceeds the stream of primary electrons, in turn indicating that the surface that has been struck by the total number of emitted electrons has adsorbed electrons, indicating that this surface is positively charged; this surface will be darker than surrounding surface areas, and for values of PE that exceed the value of PE of point 3, and by applying inverse reasoning as that which has been presented above, the conclusion can be drawn that the surface that is struck by the stream of total electrons emitted is negatively charged; this surface will be brighter than surrounding surface areas.

In sum, the above can be stated:

a surface that has a positive charge shows as a darker surface area, and a surface that has a negative charge shows as a brighter surface area.

Figure 2:
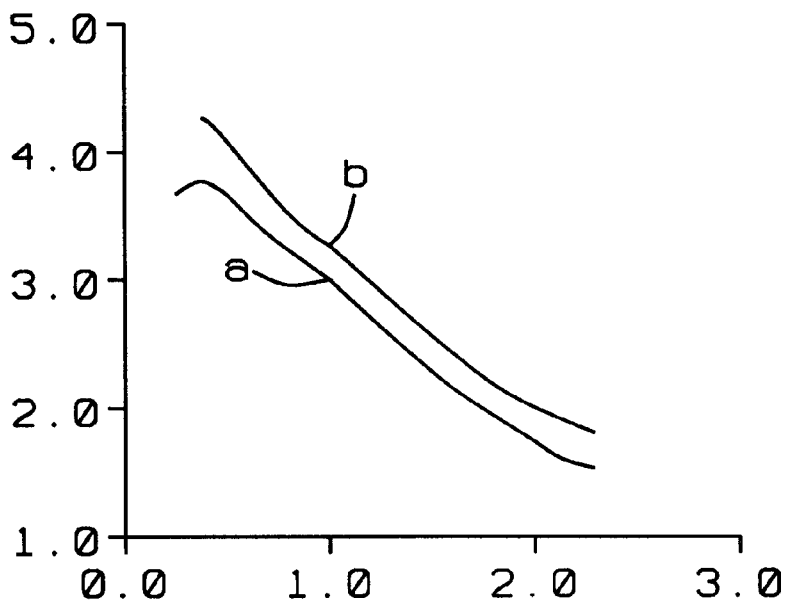
FIG. 2 shows secondary electron data for oxide, aluminum, copper and tungsten. The value for delta ($\delta$) is plotted along the vertical or Y-axis, the value for the Electron Energy in KeV is plotted along the X-axis.

FIG. 2 shows secondary electron data for oxide, aluminum, copper and tungsten. The value for delta ($\delta$) is plotted along the vertical or Y-axis, the value for the Electron Energy in KeV is plotted along the X-axis.

The following measured values apply to the curve that is shown in FIG. 2 where curve "a" represent wet $SiO_2$ and curve "b" represents sputtered $SiO_2$, Z represents the atomic number:

| Z | atom | $\delta$ | Epe (eV) |
|---|------|----------|----------|
| 13 | Al | 0.9–1.0 | 250–300 |
| 29 | Cu | 1.1–1.3 | 500–600 |
| 74 | W | 1.0–1.4 | 700 |

From these parameters can be concluded that:

SE for $SiO_2$, Cu and W is larger than 1 for low values of Epe

SE for Al is slightly smaller than 1 for low values of Epe if $SiO_2$ is large compared with 1, then $SiO_2$ will be under high positive surface charge under electron radiation.

The data illustrate that oxide is the determinate material for VC because its secondary yield can be larger than about 3 while other materials have a secondary electron yield of only about 1. From this can be concluded that surface charging will be positive after electron beam bombardment.

Figure 3:
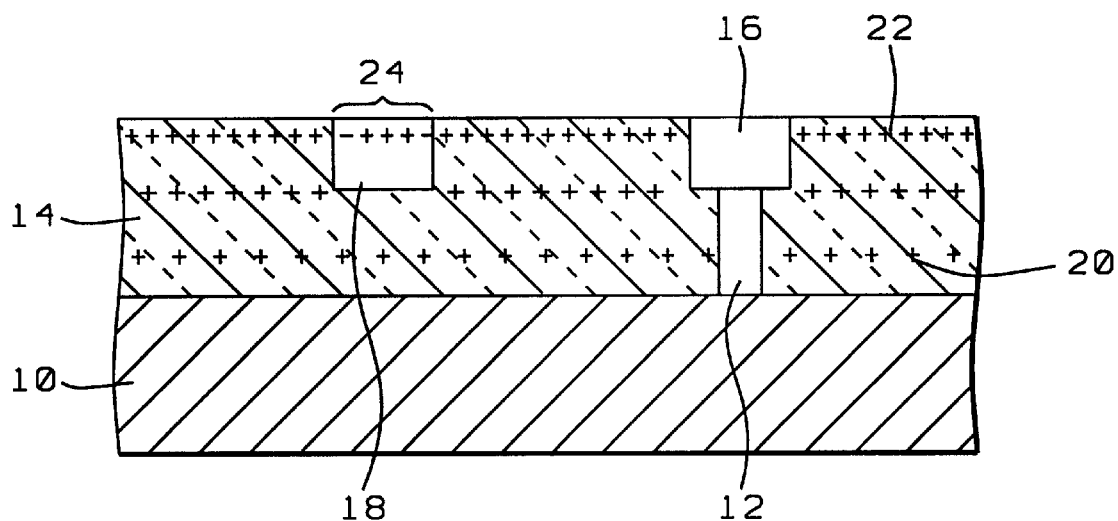
FIG. 3 further provides an explanation of the surface potential of the VC application of the invention.

FIG. 3 further provides an explanation of the surface potential of the VC application of the invention, highlighted are the following elements:

10, a conductive semiconductor surface that is connected to ground 12, a metal plug, connected to ground potential 14, a layer of dielectric coated over the surface of the ground plane 10, metal interconnects are created in, through or on the surface of layer 14

16, a connected metal interconnect line, connected to ground plane 10 by means of metal plug 12

18, a floating metal interconnected line 20, the electrical charge distribution in layer 14 of dielectric 22, the electrical charge distribution on the surface of layer 14 of dielectric 24, the surface electrical charge distribution in the surface of floating metal interconnected line 24.

From the cross section that is shown in FIG. 3, the following conclusions can be drawn:

the SE yield for even aluminum is about 0.9–1.0. Because the SE yield of SiO$_2$ is large with respect to 1, the aluminum surface will be charged slightly positive under conditions where the layer 14 of SiO$_2$ has a positive electrical field 20. For these conditions, the floating aluminum 18 will be darker than the connected metal interconnect line 16.

The above data have been presented to indicate that floating metal is darker than grounded metal. The explanation that has been provided relating to FIG. 3 serves as an introduction to VC, which is frequently used to isolate open contacts. It must be pointed out that in the above cited patents, such as U.S. Pat. No. 6,091,249 (Talbot et al.) and U.S. Pat. No. 6,038,018 (Yamazaki et al.), the methods that are provide by these patents allow for determining whether contacts are grounded or floating. In the instant invention, it has been found that increasing the electron current further helps identifying thin gate oxide, N+/PW, P+/PW and P+/NW. The referred to patents do not provide for this ability of identification.

Figure 4:
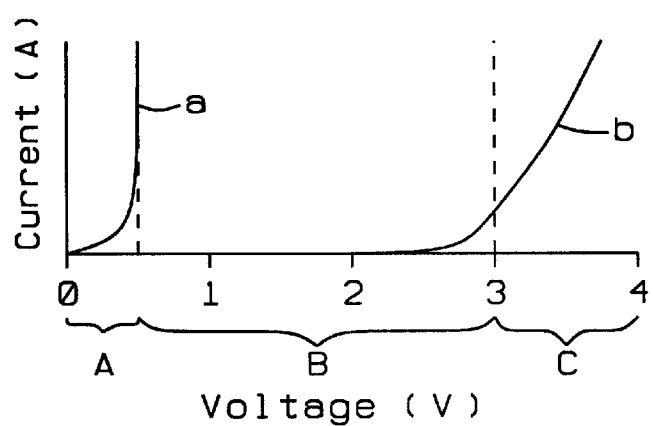
FIG. 4 further explains the VC application as it relates to N+/PW and P+/PW.

FIG. 4 further explains the VC application as it relates to N+/PW and P+/PW. Curve "a" highlighted in FIG. 4 is a P+/NW curve, curve "b" is a N+/PW curve. Since all the metal elements have been positively charged, only the positive side of the current versus voltage curves have been shown. The following comments apply to the sections of the curves shown in FIG. 4 that have been highlighted with A, B and C:

for section A: for this region a low E-beam current is applied. Since all targets that are affected by the E-beam have a leakage current of essentially equal value, no metal surface can reach an effective positive potential except for metal surfaces that are imbedded in a thick layer of oxide. For this reason, only the thick gate oxide shows up as being dark for section B: for this region a higher E-beam current is applied. The P+/PW junction is now forward biased and turns bright for section C: for this region, the value of the higher E-beam current is further raised. The N+/PW junction is now in a state of breakdown and turns bright.

The above highlighted findings lead to the conclusion that P+/PW becomes bright in region B while N+/PW becomes bright until region C is reached.

It must thereby be emphasized that conventional VC deals only with floating contacts while the instant invention includes a method that distinguishes P+/NW and N+/PW, this is further clear from the curves shown in FIG. 4.

As a final summary of the invention, a table shows regions of VC application and how these regions are detected using the invention. The columns of Table 1 represent the following conditions of the elements that are target elements of ion bombardment by E-beam or ion beam for analysis of these elements:

column #1: thick gate oxide
column #2: thin gate oxide
column #3: N+/PW junction
column #4: P+/PW junction
column #5: N+/PW,P+/PW

TABLE 1

Electron Charge Distribution, specifically in data shown are: A region is a 0–0.6 volt region, B region is a 0.6–3.0 volt region and C region is a larger than 3.0 volt region.

|  | Col. #1 | Col. #2 | Col. #3 | Col. #4 | Col. #5 |
|---|---|---|---|---|---|
| A region | >0 V | ~0 V | ~0 V | ~0 V | ~0 V |
| B region | >0.6 V | >0.6 V | >0.6 V | ~0.6 V | ~0 V |
| C region | >3 V | >3 V | ~0.3 V | ~0.6 V | ~0 V |

TABLE 2

Brightness and contrast results, using the invention:

|  | Col. #1 | Col. #2 | Col. #3 | Col. #4 | Col. #5 |
|---|---|---|---|---|---|
| A region | dark | bright | bright | bright | bright |
| B region | dark | dark | dark | bright | bright |
| C region | dark | dark | bright | bright | bright |

From region A to region C, this transition can be thought of as the user raising the current from a low current to a high current. From the data presented in the accompanying table, it can be concluded that the electron current plays a significant role in VC.

The invention can be summarized as follows:

1. a layer that needs to be analyzed is identified, the surface of the layer including overlying layers is polished (using methods of Chemical Mechanical Polishing or CMP) resulting in exposing the surface of the layer that needs to be analyzed
2. the sample placed in analysis tool such as a Focus Ion Beam (FIB) or a SEM
3. conventional methods of FIB analysis now apply a small current in the range between about 1 and 5 pA; this current has typically been kept small in order to avoid damage to the sample; the FIB analysis of the invention applies, for reasons that have been explained above, a considerably large current, typically in the range of about 3,000 to 5,000 pA
4. conventional methods of SEM analysis use a small aperture for better resolution, for instance a 30 $\mu$m aperture, while applying a voltage for the primary current of about 5 KV; the SEM analysis of the invention applies a small voltage for the primary electron stream, about 1 KV, but in addition changes the aperture in order to reach higher primary current, the aperture can be raised as high as between the range of 30 and 100 $\mu$m.

By applying the improved methods of creating primary electron emission conditions, the invention eliminates conventional restrictions whereby only open and short failures can be detected. The invention in addition allows for the identification of high resistivity in thin layers of semiconductor material, such as thin layers of gate oxide. The invention further allows for the identification of junction leakage such as N+/PW, P+/PW, N+/NW and P+/NW junctions.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. An enhanced method of creating Voltage Contrast, comprising:
   providing a substrate, said substrate comprising a layer of semiconductor material over the surface thereof, said layer of semiconductor material comprising a measuring point;
   providing a Focus Ion Beam (FIB) tool having a primary current of surface analysis;
   radiating the measuring point with a primary beam of electrons, causing secondary radiation representing the voltage at the measuring point;
   adjusting said primary current of surface analysis of said Focus Ion Beam tool to a value in the range of about 3,000 and 5,000 pA; and
   visually inspecting the surface of said layer of semiconductor material for variations in brightness on the surface thereof.

2. An enhanced method of creating Voltage Contrast, comprising:
   providing a substrate, said substrate comprising a layer of semiconductor material over the surface thereof, said layer of semiconductor material comprising a measuring point;
   providing a Scanning Electron Microscope (SIM) having a primary voltage of surface analysis, further having an aperture of surface analysis;
   radiating the measuring point with a primary beam of electrons, causing secondary radiation representing the voltage at the measuring point, the primary beam of electrons comprising a primary electron voltage of about 1 KV;
   adjusting said aperture of surface analysis to a value in the range between about 30 and 100 μm; and
   visually inspecting the surface of said layer of semiconductor material for variations in brightness on the surface thereof.

3. An enhanced method of creating Voltage Contrast, comprising:
   providing a substrate, said substrate comprising a layer of semiconductor material over the surface thereof, said layer of semiconductor material comprising a measuring point, said measuring point comprising at least one pattern of conductive interconnect material;
   providing a Focus Ion Beam (FIB) tool having a primary current of surface analysis;
   radiating the measuring point with a primary beam of electrons, causing secondary radiation representing the voltage at the measuring point;
   adjusting said primary current of surface analysis of said Focus Ion Beam tool to a value in a range of about 3,000 and 5,000 pA; and
   visually inspecting the surface of said layer of semiconductor material for variations in brightness on the surface thereof, representing an interruption or open in said at least one pattern of conductive interconnect material.

4. An enhanced method of creating Voltage Contrast, comprising:
   providing a substrate, said substrate comprising a layer of semiconductor material over the surface thereof, said layer of semiconductor material comprising a measuring point, said measuring point comprising at least one pattern of conductive interconnect material;
   providing a Scanning Electron Microscope (SIM) having a primary voltage of surface analysis, further having an aperture of surface analysis;
   radiating the measuring point with a primary beam of electrons, causing secondary radiation representing the voltage at the measuring point, the primary beam of electrons comprising a primary electron voltage of about 1 KV;
   adjusting said aperture of surface analysis to a value in the range between about 30 and 100 μm; and
   visually inspecting the surface of said layer of semiconductor material for variations in brightness on the surface thereof, representing an interruption or open in said at least one pattern of conductive interconnect material.

5. An enhanced method of creating Voltage Contrast, comprising:
   providing a substrate, said substrate comprising a layer of semiconductor material over the surface thereof, said layer of semiconductor material comprising a measuring point, said measuring point comprising at least one first pattern of conductive interconnect material, said at least one first pattern of conductive interconnect material being adjacent to at least one second pattern of conductive interconnect material;
   providing a Focus Ion Beam (FIB) tool having a primary current of surface analysis;
   radiating the measuring point with a primary beam of electrons, causing secondary radiation representing the voltage at the measuring point;
   adjusting said primary current of surface analysis of said Focus Ion Beam tool to a value in the range of about 3,000 and 5,000 pA; and
   visually inspecting the surface of said layer of semiconductor material for variations in brightness on the surface thereof, representing a short of said at least one first pattern of conductive interconnect material to said at least one second pattern of conductive interconnect material.

6. An enhanced method of creating Voltage Contrast, comprising:
   providing a substrate, said substrate comprising a layer of semiconductor material over the surface thereof, said layer of semiconductor material comprising a measuring point, said measuring point comprising at least one first pattern of conductive interconnect material, said at least one first pattern of conductive interconnect material being adjacent to at least one second pattern of conductive interconnect material;
   providing a Scanning Electron Microscope (SIM) having a primary voltage of surface analysis, further having an aperture of surface analysis;
   radiating the measuring point with a primary beam of electrons, causing secondary radiation representing the voltage at the measuring point, the primary beam of electrons comprising a primary electron voltage of about 1 KV;
   adjusting said aperture of surface analysis to a value in the range between about 30 and 100 μm; and visually inspecting the surface of said layer of semiconductor material for variations in brightness on the surface thereof, representing a short of said at least one first pattern of conductive interconnect material to said at least one second pattern of conductive interconnect material.

7. An enhanced method of creating Voltage Contrast, comprising:

providing a substrate, said substrate comprising a layer of semiconductor material over the surface thereof, said layer of semiconductor material comprising measuring point, said measuring point comprising at least on N+/PW junction;

providing a Focus Ion Beam (FIB) tool having a primary current of surface analysis;

radiating the measuring point with a primary beam of electrons, causing secondary radiation representing the voltage at the measuring point;

adjusting said primary current of surface analysis of said Focus Ion Beam tool to a value in the range of about 3,000 and 5,000 pA; and visually inspecting the surface of said layer of semiconductor material for variations in brightness on the surface thereof, said variation in brightness representing leakage current in said at least on N+/PW junction.

8. An enhanced method of creating Voltage Contrast, comprising:

providing a substrate, said substrate comprising a layer of semiconductor material over the surface thereof, said layer of semiconductor material comprising a measuring point, said measuring point comprising at least on N+/PW junction;

providing a Scanning Electron Microscope (SIM) having a primary voltage of surface analysis, further having an aperture of surface analysis;

radiating the measuring point with a primary beam of electrons, causing secondary radiation representing the voltage at the measuring point, the primary beam of electrons comprising a primary electron voltage of about 1 KV;

adjusting said aperture of surface analysis to a value in the range between about 30 and 100 μm; and visually inspecting the surface of said layer of semiconductor material for variations in brightness on the surface thereof, said variation in brightness representing leakage current in said at least on N+/PW junction.

9. An enhanced method of creating Voltage Contrast, comprising:

providing a substrate, said substrate comprising a layer of semiconductor material over the surface thereof, said layer of semiconductor material comprising a measuring point, said measuring point comprising at least on P+/PW junction;

providing a Focus Ion Beam (FIB) tool having a primary current of surface analysis;

radiating the measuring point with a primary beam of electrons, causing secondary radiation representing the voltage at the measuring point;

adjusting said primary current of surface analysis of said Focus Ion Beam tool to a value in the range of about 3,000 and 5,000 pA; and visually inspecting the surface of said layer of semiconductor material for variations in brightness on the surface thereof, said variation in brightness representing leakage current in said at least on P+/PW junction.

10. An enhanced method of creating Voltage Contrast, comprising:

providing a substrate, said substrate comprising a layer of semiconductor material over the surface thereof, said layer of semiconductor material comprising a measuring point, said measuring point comprising at least on P+/PW junction;

providing a Scanning Electron Microscope (SIM) having a primary voltage of surface analysis, further having an aperture of surface analysis;

radiating the measuring point with a primary beam of electrons, causing secondary radiation representing the voltage at the measuring point, the primary beam of electrons comprising a primary electron voltage of about 1 KV;

adjusting said aperture of surface analysis to a value in the range between about 30 and 100 μm; and visually inspecting the surface of said layer of semiconductor material for variations in brightness on the surface thereof, said variation in brightness representing leakage current in said at least on P+/PW junction.

11. A enhanced method of creating Voltage Contrast, comprising:

providing a substrate, said substrate comprising a layer of semiconductor material over the surface thereof, said layer of semiconductor material comprising a measuring point, said measuring point comprising at least on N+/NW junction;

providing a Focus Ion Beam (FIB) tool having a primary current of surface analysis;

radiating the measuring point with a primary beam of electrons, causing secondary radiation representing the voltage at the measuring point;

adjusting said primary current of surface analysis of said Focus Ion Beam tool to a value in the range of about 3,000 and 5,000 pA; and visually inspecting the surface of said layer of semiconductor material for variations in brightness on the surface thereof, said variation in brightness representing leakage current in said at least on N+/NW junction.

12. A enhanced method of creating Voltage Contrast, comprising:

providing a substrate, said substrate comprising a layer of semiconductor material over the surface thereof, said layer of semiconductor material comprising a measuring point, said measuring point comprising at least on N+/NW junction;

providing a Scanning Electron Microscope (SIM) having a primary voltage of surface analysis, further having an aperture of surface analysis;

radiating the measuring point with a primary beam of electrons, causing secondary radiation representing the voltage at the measuring point, the primary beam of electrons comprising a primary electron voltage of about 1 KV;

adjusting said aperture of surface analysis to a value in the range between about 30 and 100 μm; and visually inspecting the surface of said layer of semiconductor material for variations in brightness on the surface thereof, said variation in brightness representing leakage current in said at least on N+/NW junction.

13. A enhanced method of creating Voltage Contrast, comprising:

providing a substrate, said substrate comprising a layer of semiconductor material over the surface thereof, said layer of semiconductor material comprising a measuring point, said measuring point comprising at least on P+/NW junction;

providing a Focus Ion Beam (FIB) tool having a primary current of surface analysis;

radiating the measuring point with a primary beam of electrons, causing secondary radiation representing the voltage at the measuring point;

adjusting said primary current of surface analysis of said Focus Ion Beam tool to a value in the range of about 3,000 and 5,000 pA; and visually inspecting the surface of said layer of semiconductor material for variations in brightness on the surface thereof, said variation in brightness representing leakage current in said at least on P+/NW junction.

14. A enhanced method of creating Voltage Contrast, comprising:

providing a substrate, said substrate comprising a layer of semiconductor material over the surface thereof, said layer of semiconductor material comprising a measuring point, said measuring point comprising at least on P+/NW junction;

providing a Scanning Electron Microscope (SIM) having a primary voltage of surface analysis, further having an aperture of surface analysis;

radiating the measuring point with a primary beam of electrons, causing secondary radiation representing the voltage at the measuring point, the primary beam of electrons comprising a primary electron voltage of about 1 KV;

adjusting said aperture of surface analysis to a value in the range between about 30 and 100 $\mu$m; and visually inspecting the surface of said layer of semiconductor material for variations in brightness on the surface thereof, said variation in brightness representing leakage current in said at least on P+/NW junction.

* * * * *

UNITED STATES PATENT AND TRADEMARK OFFICE
CERTIFICATE OF CORRECTION

PATENT NO.    : 6,573,736 B1                                                   Page 1 of 1
DATED         : June 3, 2003
INVENTOR(S)   : Jeng-Han Lee and Su-Chen Lee It is certified that error appears in the above-identified patent and that said Letters Patent is hereby corrected as shown below:

<u>Title page,</u>
Item [75], delete "Su-Chen Lee, ba-de (TW)", and replace it with -- Su-Chen Lee, Ba-de (TW) --.

Signed and Sealed this

Fourteenth Day of October, 2003

JAMES E. ROGAN
*Director of the United States Patent and Trademark Office*